(12) United States Patent
Harada et al.

(10) Patent No.: US 6,949,437 B2
(45) Date of Patent: Sep. 27, 2005

(54) MANUFACTURING METHOD OF SEMICONDUCTOR DEVICE INCLUDING AN ANISOTROPIC ETCHING STEP

(75) Inventors: Fukashi Harada, Kawasaki (JP); Toshihiro Wakabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/649,746

(22) Filed: Aug. 28, 2003

(65) Prior Publication Data

US 2004/0048440 A1 Mar. 11, 2004

(30) Foreign Application Priority Data

Aug. 30, 2002 (JP) ........................................ 2002-253265

(51) Int. Cl.[7] ...................... H01L 27/082; H01L 21/302
(52) U.S. Cl. ...................... 438/309; 438/706; 438/718; 438/733; 438/734
(58) Field of Search .................................. 438/309, 706, 438/718, 719, 733, 734, 738; 257/565

(56) References Cited

U.S. PATENT DOCUMENTS 6,713,790 B2 * 3/2004 Asai et al. .................. 257/197

* cited by examiner

Primary Examiner—Ori Nadav
(74) Attorney, Agent, or Firm—Westerman, Hattori, Daniels & Adrian, LLP

(57) ABSTRACT

On a multilayer film which is formed on a semiconductor substrate, an opening which is opened on a base and an emitter is formed in the multilayer film, and after an SiGe/SiGeC film, which has a composition with a higher content of Si in an upper layer region and a lower layer region, and a higher content of Ge in an intermediate layer region, is formed on an entire surface, anisotropic dry etching is performed for the SiGe/SiGeC film up to a predetermined height of the opening.

8 Claims, 6 Drawing Sheets

MANUFACTURING METHOD OF SEMICONDUCTOR DEVICE INCLUDING AN ANISOTROPIC ETCHING STEP

CROSS-REFERENCE TO RELATED APPLICATIONS

This application is based upon and claims the benefit of priority from the prior Japanese Patent Application No. 2002-253265, filed on Aug. 30, 2002, the entire contents of which are incorporated herein by reference.

BACKGROUND OF THE INVENTION

1. Field of the Invention

The present invention relates to a manufacturing method of a semiconductor device, which is formed with a bipolar transistor being constituted by including a base, an emitter, and a collector on a semiconductor substrate.

2. Description of the Related Art

In recent years, a Bi-CMOS transistor which makes use of characteristics of both a bipolar transistor and a CMOS transistor is rapidly developed. As a requirement for the development of the Bi-CMOS transistors, enhancement of the treatment speed of the devices is cited.

In order to meet the above-described requirement, for example, in an NPN transistor that is part of the Bi-CMOS transistor, a method of increasing operation frequency of the devices by forming a $P^+$ diffusion region to be narrow and reducing a distance between $N^+$ diffusion regions, is known. However, as a result of forming the $P^+$ diffusion region to be narrow, the resistance inside the device is increased, and power consumption is increased.

With respect to the above problem, the resistance can be reduced by increasing the concentration of an impurity which is added to the $P^+$ diffusion region, but a harmful effect such as a leak current can occur by increasing the concentration of the impurity. Consequently, a semiconductor film is conventionally formed on the $P^+$ diffusion region, and the semiconductor film is electrically connected to an emitter electrode and a base electrode, respectively, whereby occurrence of a leak current, diffusion of an impurity, and the like are prevented.

Here, a conventional example of a manufacturing method of the Bi-CMOS transistor will be explained. A multilayer film is formed on a silicon semiconductor substrate, and an opening is formed in the multilayer film on the $P^+$ diffusion region functioning as a base, and on the $N^+$ diffusion region functioning as an emitter. Then, after the semiconductor film is formed on an entire surface, an inside of the opening is masked with a resist, and isotropic plasma etching for the semiconductor film is performed, whereby the semiconductor film is formed only in the opening. The semiconductor film and the base electrode are electrically connected to each other at a side wall part of the opening, and the semiconductor film and the emitter electrode are electrically connected at a bottom part of the opening.

However, the semiconductor film, which is used here, is constituted by at least two kinds of semiconductor elements, and as shown in FIG. 8, the content of Si is higher in its upper layer region and lower layer region, while the content of the other semiconductor element is higher in an intermediate layer region. The above-described respective semiconductor elements are different in the etching rate for the isotropic plasma etching. As compared with Si which mainly composes the upper layer region and the lower layer region of the compound semiconductor film, the semiconductor element which mainly composes the intermediate layer region generally has a higher etching rate, and therefore the semiconductor film after the isotropic plasma etching treatment is in a state with so-called "voids", in which clearances occur in the intermediate layer region. Accordingly, electrical connection of the base electrode, the $P^+$ diffusion region and the base electrode is hindered, thus naturally making it impossible to meet the transistor property which is initially expected.

SUMMARY OF THE INVENTION

The present invention is made in view of the above-described problem, and has its object to provide a manufacturing method of a semiconductor device, which is capable of manufacturing a semiconductor device with properties that suit the intended object, without causing voids in a compound semiconductor film after etching process.

The inventor has reached the modes of the invention shown below as a result of the earnest study.

The present invention is applied to a semiconductor device, which is formed with a bipolar transistor being composed by including a base, an emitter and a collector on a semiconductor substrate.

A manufacturing method of a semiconductor device of the present invention is characterized by including the steps of: forming a multilayer film on the aforementioned semiconductor substrate, and forming in the multilayer film an opening, which is opened on the aforementioned base and the aforementioned emitter; forming on an entire surface a compound semiconductor film having a composition with a high content of Si in an upper layer region and a lower layer region, and a high content of another semiconductor element in an intermediate layer region, and performing anisotropic dry etching for the compound semiconductor film so as to reach a certain height of the opening.

The manufacturing method of the semiconductor device of the present invention is characterized in that on performing the anisotropic dry etching for the compound semiconductor film, the anisotropic dry etching is performed in a high vacuum state. Further, the manufacturing method of the semiconductor device of the present invention is characterized by further including the step of performing quasi-anisotropic dry etching in a low vacuum state for the compound semiconductor film after the anisotropic dry etching for the compound semiconductor film is performed in the high vacuum state.

DETAILED DESCRIPTION OF THE PREFERRED EMBODIMENTS

Main Point of Invention

The present invention does not adopt an isotropic plasma etching process at all in an etching process of a compound semiconductor film and only an anisotropic dry etching process is used to perform etching for the compound semiconductor film, so that the compound semiconductor film after etching treatment is not in a stated with "voids" as exemplified by the above-described conventional example. Consequently, the present invention is capable of making etching rates of Si and another semiconductor element substantially uniform in the etching process for the compound semiconductor film, does not cause voids in the compound semiconductor film after the etching process, and makes it possible to manufacture a semiconductor device with properties which suit an intended object.

Manufacturing Method of NPN Bipolar Transistor

A preferred embodiment to which the present invention is applied will be explained in detail below with reference to the attached drawings.

FIG. 1A to FIG. 4 are schematic sectional views showing the manufacturing method of the semiconductor device according to an embodiment of the present invention in order of process steps. In the below, a case in which the manufacturing method of the semiconductor device of the present invention is applied to a manufacturing method of an NPN bipolar transistor will be explained.

Figure 1A:
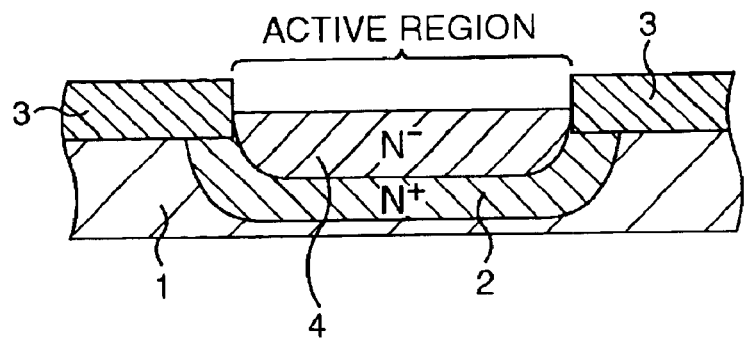
FIGS. 1A to 1C are schematic sectional views showing a manufacturing method of an NPN bipolar transistor, which is an embodiment of the present invention, in order of process steps.

In order to manufacture the NPN bipolar transistor, an n-type impurity, for example, phosphorus is ion-implanted in a surface layer of a p-type silicon semiconductor substrate 1 first as shown in FIG. 1A to form an $n^+$ diffusion region 2.

Then, a field oxide film 3 is formed in an element isolation region of the silicon semiconductor substrate 1 according to a so-called LOCOS method to demarcate an active region. Next, after coating and processing a photoresist, ion implantation of an n-type impurity such as phosphorus at low concentration, for example, is performed to form an $N^-$ diffusion region 4 on only the surface layer of the active region. This $N^-$ diffusion region 4 functions as a collector.

Figure 1B:
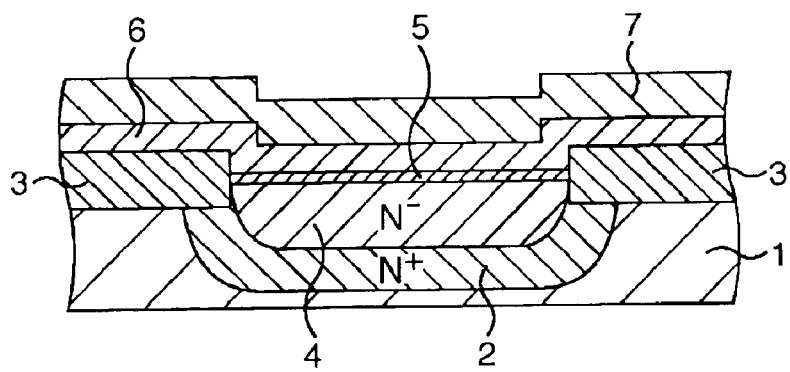

Next, as shown in FIG. 1B, a silicon oxide film 5 is formed on an entire surface according to a thermal oxide film method. Then, a polycrystalline silicon film 6, and a silicon oxide film 7 are formed in sequence according to a CVD method.

Figure 1C:
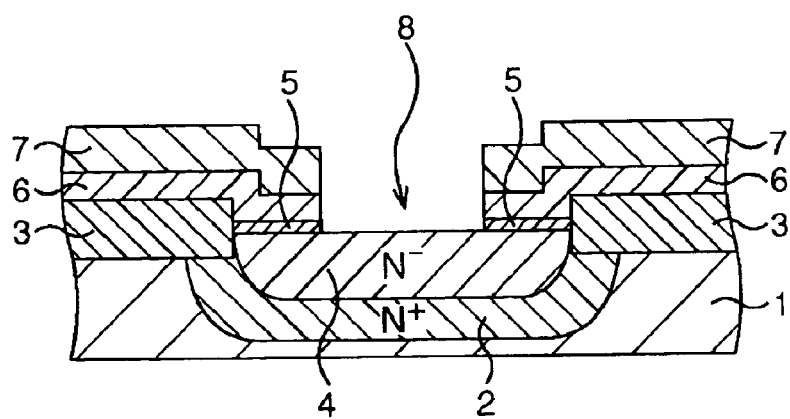

Next, as shown in FIG. 1C, by photolithography and the following dry etching, an opening 8 in which part of a surface of the $N^-$ diffusion region 4 is exposed is patterned. In this situation, the polycrystalline silicon film 6 is made a leader layer of a base electrode which is formed in a later process step.

Figure 2A:
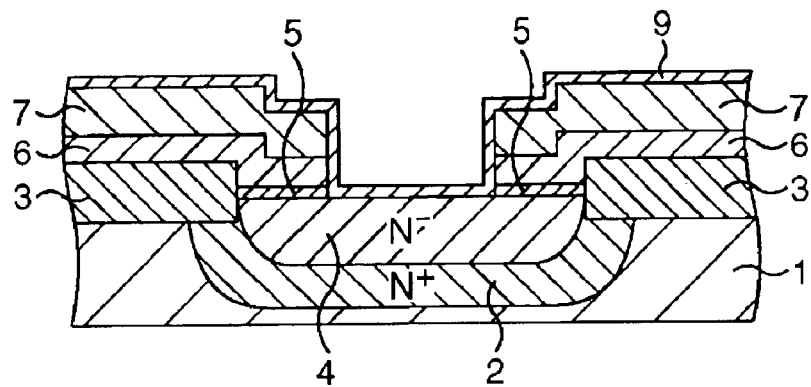
FIGS. 2A to 2C are schematic sectional views showing the manufacturing method of the NPN bipolar transistor, which is the embodiment of the present invention, in order of the process steps continued from FIGS. 1A to 1C.

Next, as shown in FIG. 2A, according to a decompression type nonselective epitaxial growth method, an SiGe/SiGeC film 9 is grown on an entire surface of the silicon oxide film 7 to cover an inner wall of the opening 8. Then, a p-type impurity such as boron is ion-planted in the SiGe/SiGeC film 9.

Figure 2B:
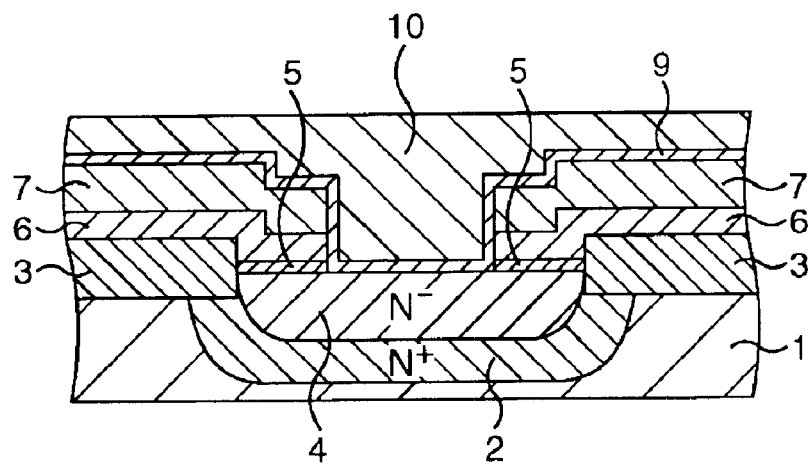

Next, as shown in FIG. 2B, a photoresist 10 that is to be a mask material is coated.

Figure 2C:
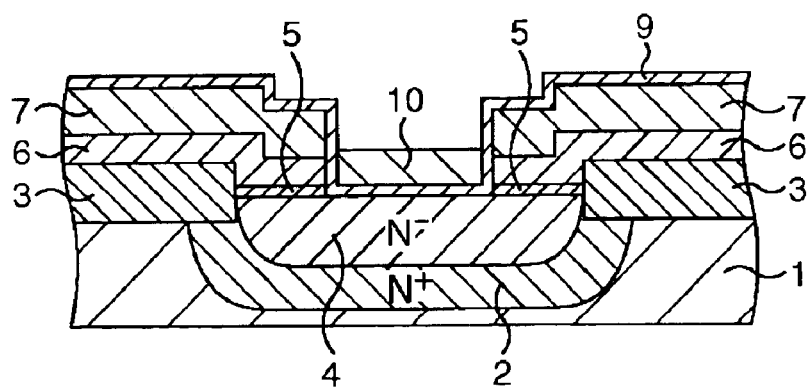

Next, as shown in FIG. 2C, anisotropic dry etching is performed for an entire surface of the photoresist 10, and the photoresist 10 is left up to about a half a height of the opening 8.

Figure 3A:
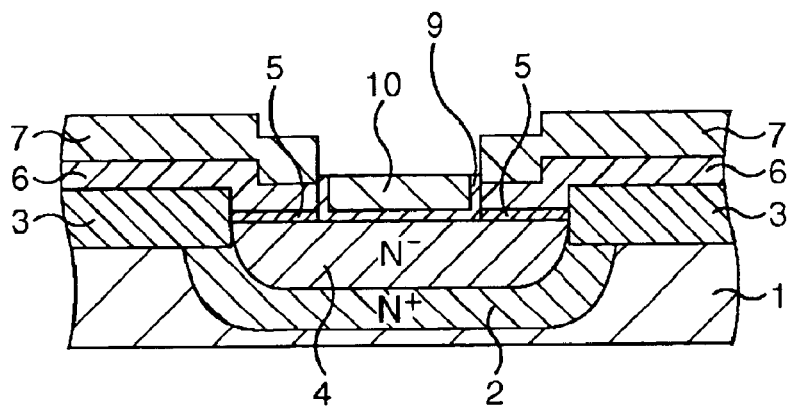
FIGS. 3A to 3C are schematic sectional views showing the manufacturing method of the NPN bipolar transistor, which is the embodiment of the present invention, in order of the process steps continued from FIGS. 2A to 2C.

Next, as shown in FIG. 3A, anisotropic dry etching is performed for the SiGe/SiGeC film 9 with the photoresist 10 as a mask under the following conditions, and the SiGe/SiGeC film 9 is left up to the depth following the photoresist 10. This SiGe/SiGeC film 9 functions as a base.

In this embodiment, in a manufacturing process step shown in FIG. 3A, anisotropic dry etching is performed with use of an ECR (electric cyclone resonance) etching device. The conditions at the time of the etching treatment are as follows: a flow rate ratio of $Cl_2$ and $O_2$ is about 50 (sccm):5 (sccm), an inside of the ECR etching device is in a high vacuum state with atmospheric pressure of about $3.3 \times 10^{-1}$ (Pa) (2.5 (m Torr)), microwave is generated at about 1.0 (kw), radio-frequency (RF) is applied to the electrode at about 30W, and electrode temperature is set at about 0° C. As for an etching rate during the anisotropic dry etching treatment for the SiGe/SiGeC film 9 under these conditions, Ge is about 1.2 if Si is assumed to be 1.

In this regard, in the manufacturing process step shown in FIG. 3A, when the SiGe/SiGeC film 9 is formed in only the opening 8 by performing isotropic plasma etching for the SiGe/SiGeC film 9 as conventional, or by performing isotropic plasma etching up to a certain height from a low portion of the opening 8 after performing half etching of anisotropic dry etching, the etching rate of Ge during this isotropic plasma etching treatment is as high as 3 to 7 if the etching rate of Si during this time is assumed to be 1. Consequently, when isotropic plasma etching is performed for the SiGe/SiGeC film 9, the intermediate layer region of the SiGe/SiGeC film 9, which is formed on the side wall part of the opening 8, is got rid of, because the etching rate in the intermediate layer region is higher as compared with those of the upper layer region and the lower layer region, and the SiGe/SiGeC film 9 after etching is in the state with so-called "voids".

Figure 5:
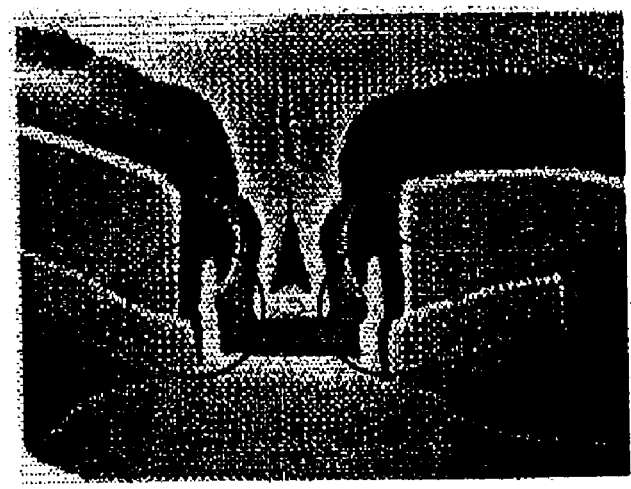
FIG. 5 is a microphotograph showing a surface state of a section of an NPN bipolar transistor manufactured with use of a manufacturing method of another semiconductor device, which is taken by an SEM (scanning electron microscope)

Accordingly, electrical connection of the base electrode, the $P^+$ diffusion region and the base electrode is hindered, and it naturally becomes impossible to meet the initially expected transistor properties. FIG. 5 is a microphotograph showing a surface state of a section of an NPN bipolar transistor manufactured with use of isotropic plasma etching, which is taken by an SEM(scanning electron microscope). As shown in the circle in FIG. 5, it is found out that the SiGe/SiGeC film 9 is in the state with "voids".

Meanwhile, the etching rate of Ge in this embodiment is about 1.2 times as high as that of Si, but this is not at the level which brings the SiGe/SiGeC film 9 after etching treatment into the state with "voids", and at this level, the SiGe/SiGeC film 9 can be formed substantially ideally. Consequently, according to this embodiment, the NPN bipolar transistor, which suits the intended objects such as increase in speed of the device and reduction in power consumption, can be manufactured while the harmful effect such as occurrence of a leak current accompanying addition of an impurity at high concentration to the $P^+$ diffusion region is avoided.

In this embodiment, as described above, anisotropic dry etching is performed with the inside of the ECR etching device is in a high vacuum state with the atmospheric pressure of about $3.3 \times 10^{-1}$ (Pa) (2.5 (mTorr)), whereby the etching rates of Si and Ge are made substantially uniform to provide the above-described operational effect of this embodiment itself. However, this operational effect is not specially realized only at the above-described numeral value of the atmospheric pressure, but if only the atmospheric pressure is 66.5 (Pa) (500 mTorr)) or lower, the etching rates of Si and Ge also become substantially uniform and it becomes possible to avoid SiGe/SiGeC film 9 from being in the state with "voids" after the etching treatment.

Figure 3B:
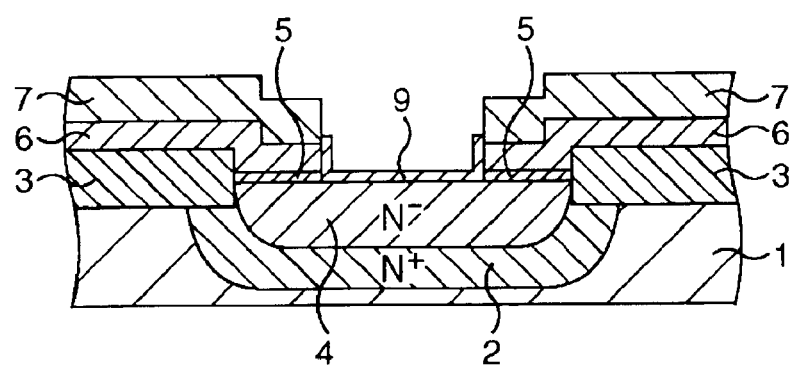

Next, as shown in FIG. 3B, the photoresist 10 is removed by ashing treatment or the like. The SiGe/SiGeC film 9 that is formed here is electrically connected to the base electrode via the polycrystalline silicon film 6 at its side wall portion, and is electrically connected to the emitter electrode at its bottom portion according to the following process step.

Figure 3C:
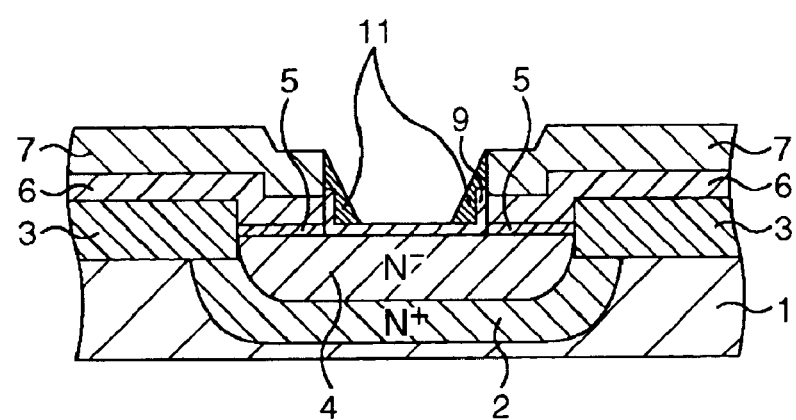

Next, as shown in FIG. 3C, the silicone oxide film is deposited on the entire surface by the CVD method, and anisotropic dry etching (etch back) is performed for the entire surface, whereby a central region of the bottom part of the SiGe/SiGeC film 9 is exposed, and a side wall 11, which covers the rest of the bottom part, the side wall part and the silicon oxide film 7, is formed.

Figure 4:
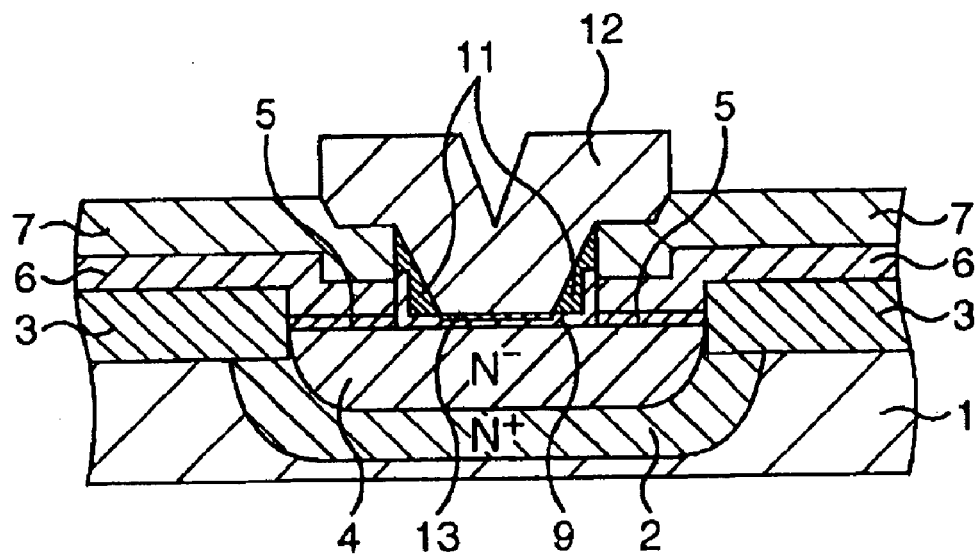
FIG. 4 is a schematic sectional view showing the manufacturing method of the NPN bipolar transistor, which is the embodiment of the present invention, in order of the process steps continued form FIGS. 3A to 3C.

Next, as shown in FIG. 4, an n-type polycrystalline silicon film or an amorphous silicon film is deposited on the entire surface by the CVD method, which is treated with photolithography and the following dry etching, whereby the emitter electrode 12, which is connected to the SiGe/SiGeC film 9 at the low region, is formed. In this situation, by the action of heat when the n-type polycrystalline silicon film or amorphous silicon film is deposited and the heat treatment thereafter, part of the n-type impurity contained therein diffuses onto the surface layer of the bottom part of the SiGe/SiGeC film 9, and an $n^+$ diffusion region 13 with small depth is formed. This $n^+$ diffusion region 13 functions as the emitter.

Figure 6:
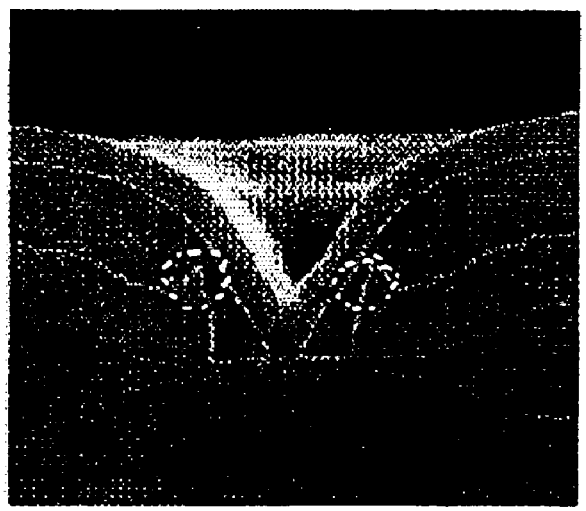
FIG. 6 is a microphotograph showing a surface state of a section of the NPN bipolar transistor after anisotropic dry etching treatment, which is taken by the SEM (scanning electron microscope)

As described above, in this embodiment, by performing anisotropic dry etching in the high vacuum state, the SiGe/SiGeC film 9 can be avoided from being in the state with "voids". However, even if the SiGe/SiGeC film 9 is avoided from being in the state with "voids" after the anisotropic dry etching, etching in the lateral direction is not performed in anisotropic dry etching, and a lower layer portion of the SiGe/SiGeC film 9 with high content of Si sometimes remains at the side wall of the opening 8. FIG. 6 is a microphotograph showing the surface state of the section of the NPN bipolar transistor after the anisotropic dry etching treatment, which is taken by the SEM (scanning electron microscope), and as shown in the circle in FIG. 6, the angular residual of the SiGe/SiGeC film 9 can be confirmed at the side wall of this opening 8. Hereinafter, the lower layer portion of the SiGe/SiGeC film 9 remaining at the side wall of the opening 8 is called a "Si residue".

In this embodiment, when the "Si residue" remains at the side wall of the opening 8 as described above, the etching process to remove this "Si residue" is added. In concrete, quasi-anisotropic dry etching which also has an etching action in a horizontal direction is performed after the anisotropic dry etching process that is explained with use of FIG. 3A, and the "Si residue" is removed. The conditions according to the quasi-anisotropic dry etching will be shown below.

Figure 7:
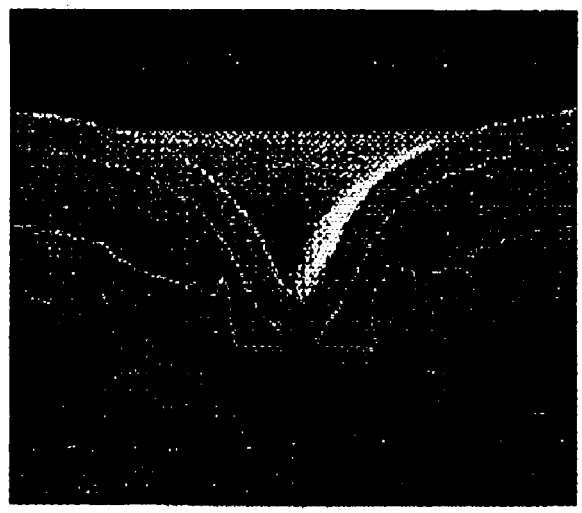
FIG. 7 is a microphotograph showing a surface state of a section of the NPN bipolar transistor after quasi-anisotropic dry etching treatment, which is taken by the SEM (scanning electron microscope)
Figure 8:
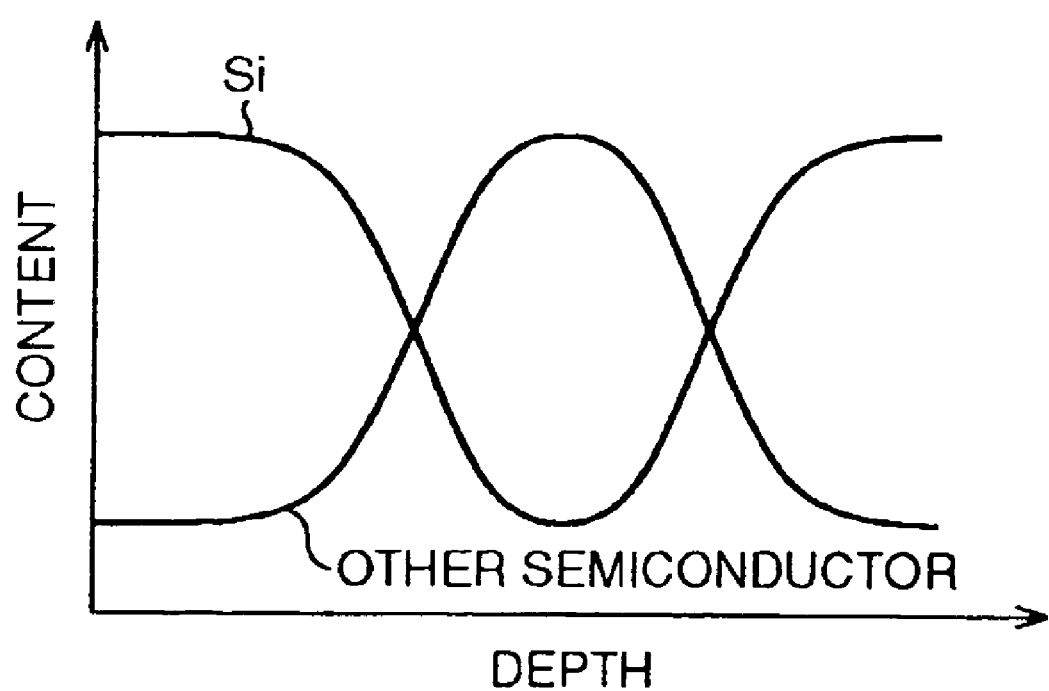
FIG. 8 is a graph showing relationship between depth and content of elements of a semiconductor film that is generally used.

In this embodiment, the above-described quasi-anisotropic dry etching is performed with use of a parallel plate type RIE device. The conditions during the quasi-anisotropic dry etching treatment are as follows: the flow rate ratio of $O_2$ and $C_2F_6$ is about 12 (SLM):60 (sccm), the inside of the parallel plate type RIE device is made the low vacuum state with the atmospheric pressure of about $40 \times 10^2$ (Pa) (30 (Torr)), and radio-frequency is applied to the electrode at about 700 (w). The etching rate in the horizontal direction under these conditions, namely, the etching rate for the "Si residue" is 60 (Å/min), and the quasi-anisotropic dry etching is performed for a time period corresponding to the film thickness of the "Si residue", whereby it becomes possible to remove the "Si residue". FIG. 7 is a microphotograph showing a surface state of a section of the NPN bipolar transistor after quasi-anisotropic dry etching treatment, which is taken by the SEM (scanning electron microscope). As shown in the circle in FIG. 7, it is confirmed that the "Si residue" as shown in the circle in FIG. 6 is removed.

For example, if the "Si residue" remains up to the high position of the side wall of the opening 8, and the opening of the emitter electrode is formed in this state, there is the fear that the emitter electrode 12 is in contact with the "Si residue" to cause shorts in the SiGe/SiGeC film 9 and the emitter electrode 12. According to this embodiment, the "Si residue" which may cause a harmful effect to such a transistor function can be completely removed, and it becomes possible to manufacture the NPN bipolar transistor with high reliability, which is one intended object.

In this embodiment, as described above, the inside of the parallel plate type RIE device is made a low vacuum state with the atmospheric pressure of about $40 \times 10^2$ (Pa) (30 (Torr)), and quasi-anisotropic dry etching is performed, whereby it is made possible to remove the "Si residue". However, removal of the "Si residue" is not specially realized only at the above-described atmospheric pressure numeral value, but it also becomes possible to perform quasi-anisotropic dry etching which can remove the "Si residue" if only the atmospheric pressure inside the device is 133 (Pa) (1 (Torr)) or higher.

According to the present invention, etching is performed for the compound semiconductor film by using only the anisotropic dry etching process, and therefore the etching rates of Si and the other semiconductor element can be made substantially uniform in the etching process for the compound semiconductor film, thus causing no voids in the compound semiconductor film after the etching process, and making it possible to manufacture the semiconductor device with properties which suit the intended object.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device which is formed with a bipolar transistor being composed by including a base, an emitter and a collector on a semiconductor substrate, comprising the steps of:

forming a multilayer film on said semiconductor substrate, and forming an opening, which is opened on said base and said emitter, in the multilayer film;

forming on an entire surface a compound semiconductor film which contains silicon and an other semiconductor element, and has a composition with a high content of silicon in an upper layer region and a lower layer region, and a high content of the other semiconductor element in an intermediate layer region;

performing anisotropic dry etching for the compound semiconductor film so as to reach a certain height of the opening, but performing no isotropic etching, wherein the anisotropic dry etching is performed for the compound semiconductor film in a high vacuum state; and further comprising the step of:

performing quasi-anisotropic dry etching for the compound semiconductor film in a low vacuum state after the anisotropic dry etching is performed for the compound semiconductor film in the high vacuum state.

2. The manufacturing method of the semiconductor device according to claim 1, wherein atmospheric pressure in the low vacuum state is 133 (Pa) or higher.

3. The manufacturing method of the semiconductor device according to claim 1, wherein atmospheric pressure in the low vacuum state is about $40 \times 10^2$ (Pa).

4. The manufacturing method of the semiconductor device according to claim 1, wherein the compound semiconductor film comprises an SiGe film or an SiGeC film.

5. A manufacturing method of a semiconductor device, comprising the steps of:

forming a thin film on a semiconductor substrate, and forming an opening in part of the thin film;

forming on an entire surface a compound semiconductor film which contains a first semiconductor element and a second semiconductor element, and has a composition with a high content of the first semiconductor element in an upper layer region and a lower layer region, and a high content of the second semiconductor element in an intermediate layer region;

performing an anisotropic dry etching for the compound semiconductor film so as to reach a certain height of the opening, but performing no isotropic etching, wherein the anisotropic dry etching is performed for the compound semiconductor film in a high vacuum state; and further comprising the step of: performing quasi-anisotropic dry etching for the compound semiconductor film in a low vacuum state after the anisotropic dry etching is performed for the compound semiconductor film in the high vacuum state.

6. The manufacturing method of the semiconductor device according to claim 5, wherein atmospheric pressure in the low vacuum state is 133 (Pa) or higher.

7. The manufacturing method of the semiconductor device according to claim 5, wherein atmospheric pressure in the low vacuum state is about $40 \times 10^2$ (Pa).

8. The manufacturing method of the semiconductor device according to claim 5, wherein the compound semiconductor film comprises an SiGe film or an SiGeC film.

* * * * *